United States Patent [19]
Choi

[11] Patent Number: 5,998,557
[45] Date of Patent: Dec. 7, 1999

[54] CHEMICALLY AMPLIFIED RESISTS

[75] Inventor: Sang-jun Choi, Kyungki-do, Rep. of Korea

[73] Assignee: Samsung Electronics Co., Ltd., Rep. of Korea

[21] Appl. No.: 09/265,150

[22] Filed: Mar. 9, 1999

Related U.S. Application Data

[63] Continuation of application No. 08/942,249, Oct. 1, 1997.

[30] Foreign Application Priority Data

Apr. 10, 1997 [KR] Rep. of Korea ..................... 97-13219

[51] Int. Cl.$^6$ ................................ C08F 30/08; G03C 1/72
[52] U.S. Cl. ..................... 526/279; 526/313; 430/270.1; 430/905; 430/910
[58] Field of Search ..................... 526/279, 313; 430/270.1, 905, 910

[56] References Cited

U.S. PATENT DOCUMENTS 4,780,516  10/1988  Foley, Jr. ............................... 526/264
5,883,152   3/1999  Anan et al. ............................. 523/106

OTHER PUBLICATIONS

Kotachi et al.; Si–Containing Positive Resists For ArF Excimer Laser Lithography; *Journal of Photopolymer Science and Technology*; vol. 8, No. 4 (1995); pp. 615–622.

*Primary Examiner*—Janet Baxter
*Assistant Examiner*—Yvette M. Clarke
*Attorney, Agent, or Firm*—Myers Bigel Sibley & Sajovec

[57] ABSTRACT

In general, the invention provides polymers which may be used in chemically amplified resists. More particularly, the invention relates to esterified polymers containing the group:

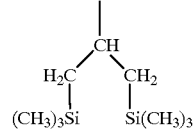

Resist compositions comprise the esterified polymers and photoacid generators.

5 Claims, 10 Drawing Sheets

CHEMICALLY AMPLIFIED RESISTS

CROSS-REFERENCE TO RELATED APPLICATIONS

The instant application is a continuation application of U.S. application Ser. No. 08/942,249 filed Oct. 1, 1997, the disclosure of which is incorporated herein by reference in its entirety.

FIELD OF THE INVENTION

The invention relates to chemically amplified resists. More specifically, the invention relates to chemically amplified resists which contain silicon.

BACKGROUND OF THE INVENTION

Conventional circuit devices which are highly integrated (e.g., semiconductors) typically contain fine patterns. In order to fabricate such devices, it is highly desirable to develop new lithography processes. For example, new resist materials which can react to light emitted from an ArF excimer laser having wavelengths of about 193 nm may be utilized.

In conventional semiconductor device manufacturing processes, single layer resists (SLRs) or bi-layer resists (BLRs) are typically utilized. An SLR is usually less sophisticated than a BLR. However, when an SLR is used in forming a resist pattern, it may be difficult to ensure a sufficient dry etch resistance. Moreover, a resist pattern formed from an SLR may become slanted and collapse in the event the aspect ratio increases.

A conventional BLR usually contains silicon. With respect to a BLR, a process for forming a resist pattern may be more complicated relative to a process using an SLR. Nonetheless, a process involving a BLR may be more advantageous than a process which utilizes an SLR. In particular, silicon atoms of the resist material are typically converted to glass during an $O_2$ plasma dry etching process. As a result, a cured layer may be formed on the surface of the resist layer. The cured layer can serve as an etching mask during a subsequent dry etching process. Thus, a resist pattern having a high aspect ratio may be readily formed.

When manufacturing a BLR, the silicon content of a polymer which is employed may play a significant role. A silicon-containing polymer intended to be used as a BLR for an ArF excimer laser lithography process is proposed by Kotachi, A., "Si-Containing Positive Resist for ArF Excimer Laser Lithography", *Journal of Photopolymer Science and Technology*, 8:4, p. 615 (1995). The silicon content of the polymer is taught to be around 8 weight percent. Considering that it may be more preferable to have employ a polymer having a silicon content of at least 10 weight percent, it may be difficult to obtain a sufficiently high aspect ratio utilizing the polymer proposed by Kotachi et al. Additionally, the polymer proposed in Kotachi et al. may display inferior adhesive properties. As a result, a resist layer which contains the polymer may detach from an underlying layer in a device comprising the resist layer.

There remains a need in the art to address the potential difficulties associated with conventional polymeric materials used in resist layers.

SUMMARY OF THE INVENTION

It is an object of the invention to provide polymers which may be suitable for use as BLRs which are employed in excimer laser lithography processes.

It is another object of the invention to provide chemically amplified resist compositions which comprise the polymers.

The invention relates to polymers which may be used in a chemically amplified resists. As an example, the invention provides polymers represented by the formula:

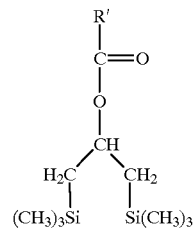

R' is selected from the group consisting of:

a)

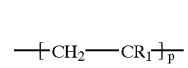

wherein $R_1$ is selected from the group consisting of hydrogen and methyl, and p is an integer which is selected such that said polymers have weight average molecular weights ranging from about 3,000 to about 200,000;

b)

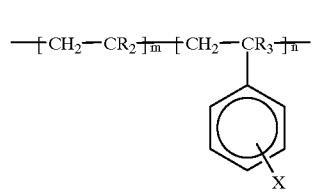

wherein $R_2$ is selected from the group consisting of hydrogen and methyl; $R_3$ is selected from the group consisting of hydrogen and methyl; and X is selected from the group consisting of hydrogen, hydroxyl, halogen, $C_1$–$C_4$ alkyl, and $C_1$–$C_4$ alkoxy; m and n are integers, and the ratio m/(m+n) ranges from about 0.1 to about 0.9;

c)

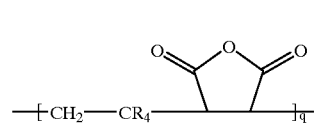

wherein $R_4$ is selected from the group consisting of hydrogen and methyl, and q is an integer which is selected such that the weight average molecular weight of the polymers range from about 3,000 to about 100,000;

d)

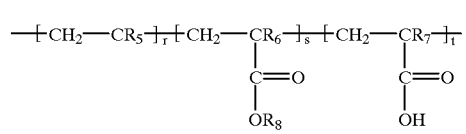

wherein $R_5$ is selected from the group consisting of hydrogen and methyl; $R_6$ is selected from the group consisting of hydrogen and methyl; $R_7$ is selected from the group consisting of hydrogen and methyl; $R_8$ is selected from the group consisting of methyl, 2-hydroxyethyl, and $C_2$–$C_6$ alkyl; wherein r, s, and t are integers, the ratio of r/(r+s+t) ranges from about 0.1 to about 0.9, the ratio of s/(r+s+t) ranges from about 0.1 to about 0.9, and the ratio of t/(r+s+t) ranges from about 0.1 to about 0.5; and e)
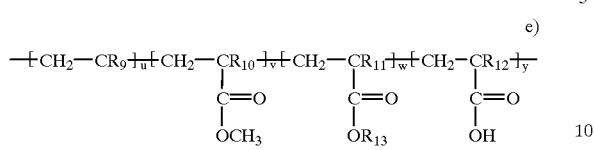

wherein $R_9$ is selected from the group consisting of hydrogen and methyl, $R_{10}$ is selected from the group consisting of hydrogen and methyl, $R_{11}$ is selected from the group consisting of hydrogen and methyl, $R_{12}$ is selected from the group consisting of hydrogen and methyl, $R_{13}$ is selected from the group consisting of t-butyl, tetrahydropyranyl, 2-hydroxyethyl, and $C_2$–$C_6$ alkyl; wherein u, v, w, and y are integers, and the ratio u/(u+v+w+y) ranges from about 0.1 to about 0.9; the ratio v/(u+v+w+y) ranges from about 0.1 to about 0.9; the ratio w/(u+v+w+y) ranges from about 0.1 to about 0.9; and the ratio y/(u+v+w+y) ranges from about 0.1 to about 0.5.

The invention also encompasses resist compositions which comprise the polymers described above along with photoacid generators.

DETAILED DESCRIPTION OF THE PREFERRED EMBODIMENTS

Figure 1:
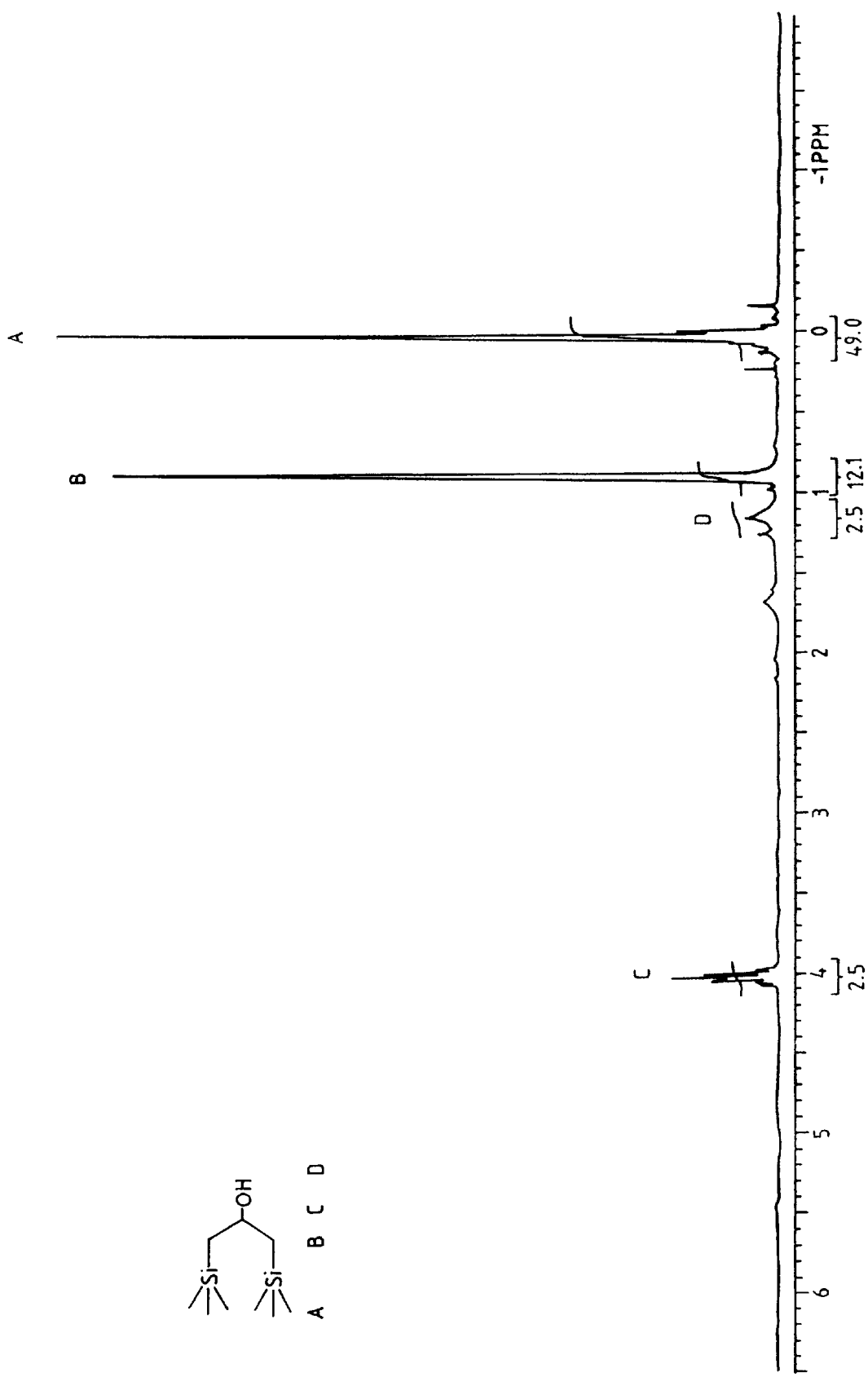
FIG. 1 is a graph illustrating a nuclear magnetic resonance (NMR) analysis for an intermediate material used in synthesizing a polymer of the invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In general, the invention provides polymers which may be used in chemically amplified resists. More particularly, the invention relates to esterified polymers containing the group:

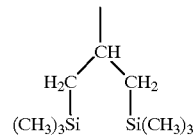

Specific examples of polymers may be represented by the formula:

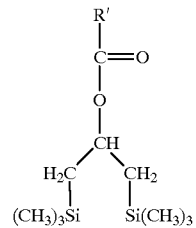

wherein R' is selected from the group consisting of:

a)
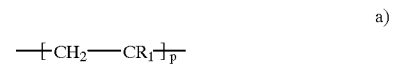

wherein $R_1$ is selected from the group consisting of hydrogen and methyl, and p is an integer which is selected such that the polymers have weight average molecular weights ranging from about 3,000 to about 200,000;

b)
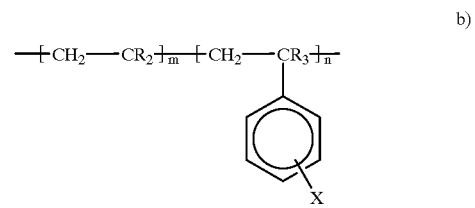

wherein $R_2$ is selected from the group consisting of hydrogen and methyl; $R_3$ is selected from the group consisting of hydrogen and methyl; and X is selected from the group consisting of hydrogen, hydroxyl, halogen, $C_1$–$C_4$ alkyl, and $C_1$–$C_4$ alkoxy; m and n are integers, and the ratio m/(m+n) ranges from about 0.1 to about 0.9;

c)
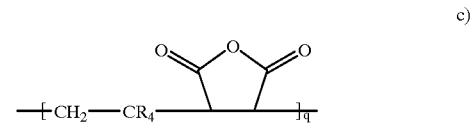

wherein $R_4$ is selected from the group consisting of hydrogen and methyl, and q is an integer which is selected such that the weight average molecular weight of the polymers range from about 3,000 to about 100,000;

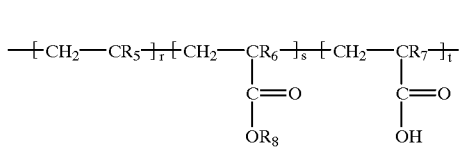

d)

wherein $R_5$ is selected from the group consisting of hydrogen and methyl; $R_6$ is selected from the group consisting of hydrogen and methyl; $R_7$ is selected from the group consisting of hydrogen and methyl; $R_8$ is selected from the group consisting of methyl, 2-hydroxyethyl, and $C_2$–$C_6$ alkyl; wherein r, s, and t are integers, the ratio of r/(r+s+t) ranges from about 0.1 to about 0.9, the ratio of s/(r+s+t) ranges from about 0.1 to about 0.9, and the ratio of t/(r+s+t) ranges from about 0.1 to about 0.5; and

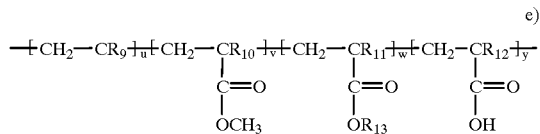

e)

group consisting of hydrogen and methyl, $R_{11}$ is selected from the group consisting of hydrogen and methyl, $R_{12}$ is selected from the group consisting of hydrogen wherein $R_9$ is selected from the group consisting of hydrogen and methyl, $R_{10}$ is selected from the and methyl, $R_{13}$ is selected from the group consisting of t-butyl, tetrahydropyranyl, 2-hydroxyethyl, and $C_2$–C6 alkyl; wherein u, V, W, and y are integers, and the ratio u/(u+v+w+y) ranges from about 0.1 to about 0.9; the ratio v/(u+v+w+y) ranges from about 0.1 to about 0.9; the ratio w/(u+v+w+y) ranges from about 0.1 to about 0.9; and the ratio y/(u+v+w+y) ranges from about 0.1 to about 0.5.

In embodiments in which R' is

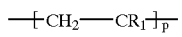

$R_1$ is preferably methyl.

In embodiments in which R' is

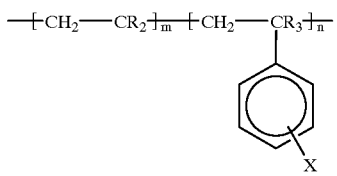

$R_2$ is preferably methyl, $R_3$ is hydrogen, and X preferably is hydrogen.

The polymers in these embodiments preferably have weight average molecular weights ranging from about 5,000 to about 200,000.

In the embodiments in which R' is

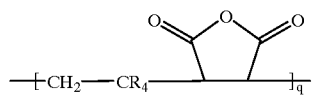

$R_4$ is preferably methyl.

In the embodiments in which R' is

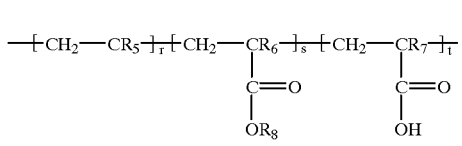

$R_5$ is preferably methyl, $R_6$ is preferably methyl, and $R_7$ is preferably methyl. The weight average molecular weights of the polymers in these embodiments preferably range from about 5,000 to about 200,000.

In the embodiments in which R' is

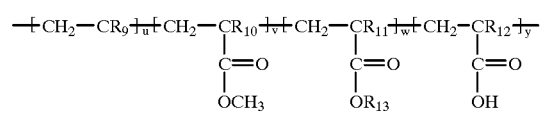

$R_9$ is preferably methyl, $R_{10}$ is preferably methyl, $R_{11}$ is preferably methyl, and $R_{12}$ is preferably methyl. In these embodiments, the polymers preferably have weight average molecular weights ranging from about 5,000 to about 200,000.

In addition to the above, the invention provides resist compositions which comprise the polymers recited herein along with photoacid generators. These components may be used in various amounts. Preferably, the resist compositions comprise from about 1 to about 20 percent of the photoacid generators based on the weights of the resist compositions.

A number of photoacid generators may be used in the resist compositions, the selection of which are known by one skilled in the art. Preferably, the photoacid generators are selected from the group consisting of triarylsulfonium salts, diaryliodonium salts, and mixtures thereof. Examples of these compounds include, but are not limited to, triphenylsulfonium triflate, diphenyliodonium triflate, and mixtures thereof.

The invention may be advantageous in that resist compositions which include the polymeric materials of the invention allow layers containing the compositions to potentially display excellent adhesion to underlayers present in integrated circuit devices.

The following examples are provided to illustrate the present invention, and should not be construed as limiting thereof.

EXAMPLE 1

Synthesis of a Monomer

A reaction used in synthesizing a monomer represented by formula (II) and an intermediate represented formula (I) is described below.

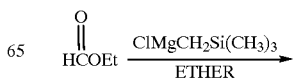

-continued

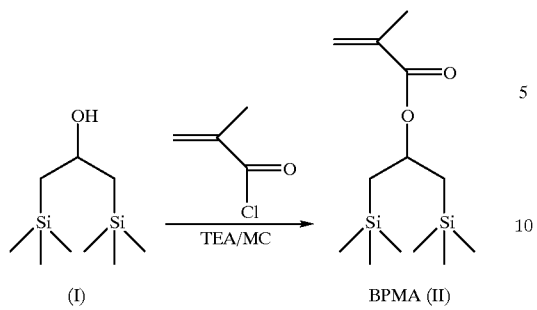

(1) Synthesis of 1,3-bis(trimethylsilyl)-2-propanol (I)

Ethyl formate (0.1 mol) was slowly added to 0.3 mol of trimethylsilylmethyl magnesium chloride solution dissolved in diethyl ether which was contained in a 500 ml flask. The mixture was allowed to react under reflux for about 24 hours. After hydrolyzing the reactant using ammonium hydrochloride solution, the obtained reaction product was separated and purified by a vacuum distillation and a 70 percent yield was obtained. The structure of the obtained distillates was analyzed using NMR and a spectroscopic method of FT-IR spectroscopy.

FIG. 1 illustrates the result of the NMR analysis of the 1,3-bis(trimethylsilyl)-2-propanol of formula (I) obtained by the above method.

Figure 2:
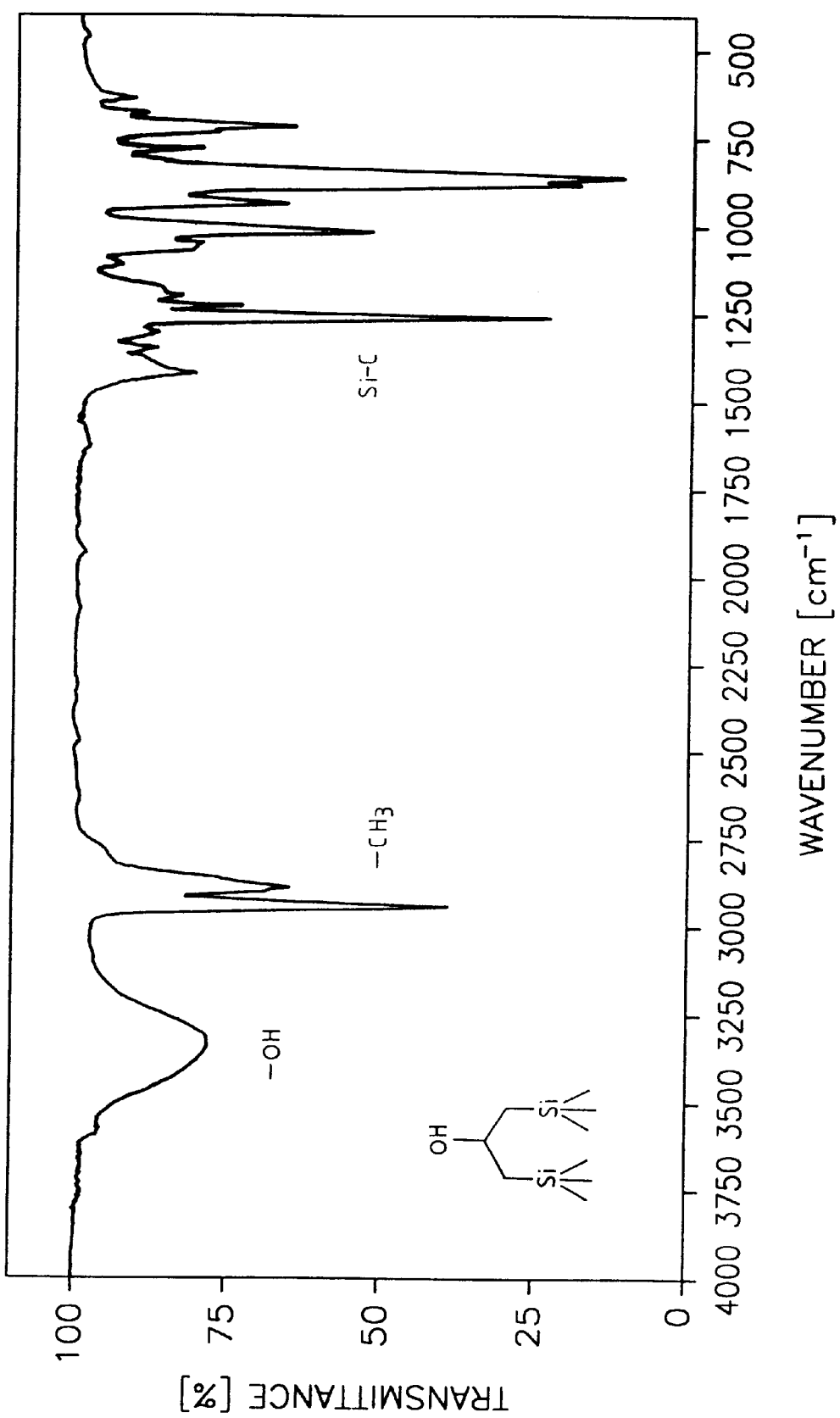
FIG. 2 is a graph illustrating a Fourier Transform Infrared Radiation (FT-IR) analysis for an intermediate product used in synthesizing a polymer of the invention.

FIG. 2 illustrates the results of an FT-IR analysis of the same. The results obtained from the above graphs are as follows.
$^1$H-NMR(CDCl$_3$, ppm): 0.0(18H, —CH$_3$), 0.9(4H, —CH$_2$—), 1.2(1H, —OH), 4.0(1H, —CH—)FT-IR(NaCl, cm$^{-1}$: 3300(—OH), 2950(C—H), 1400 and 1260 (Si—C)

(2) Synthesis of 1,3-bis(trimethylsiliyl)propyl methacrylate (BPMA) (II)

0.1 mol of 1,3-bis(trimethylsilyl)-2-propanol represented by formula (I) and 0.1 mol of triethylamine (TEA) were dissolved in methylene chloride contained in a 500 ml flask. 0.1 mol of methacryloyl chloride was slowly added to the dissolved reactant, and the mixture was refluxed for 24 hours. The obtained product was separated by vacuum distillation and the product yield was 75 percent.

Figure 3:
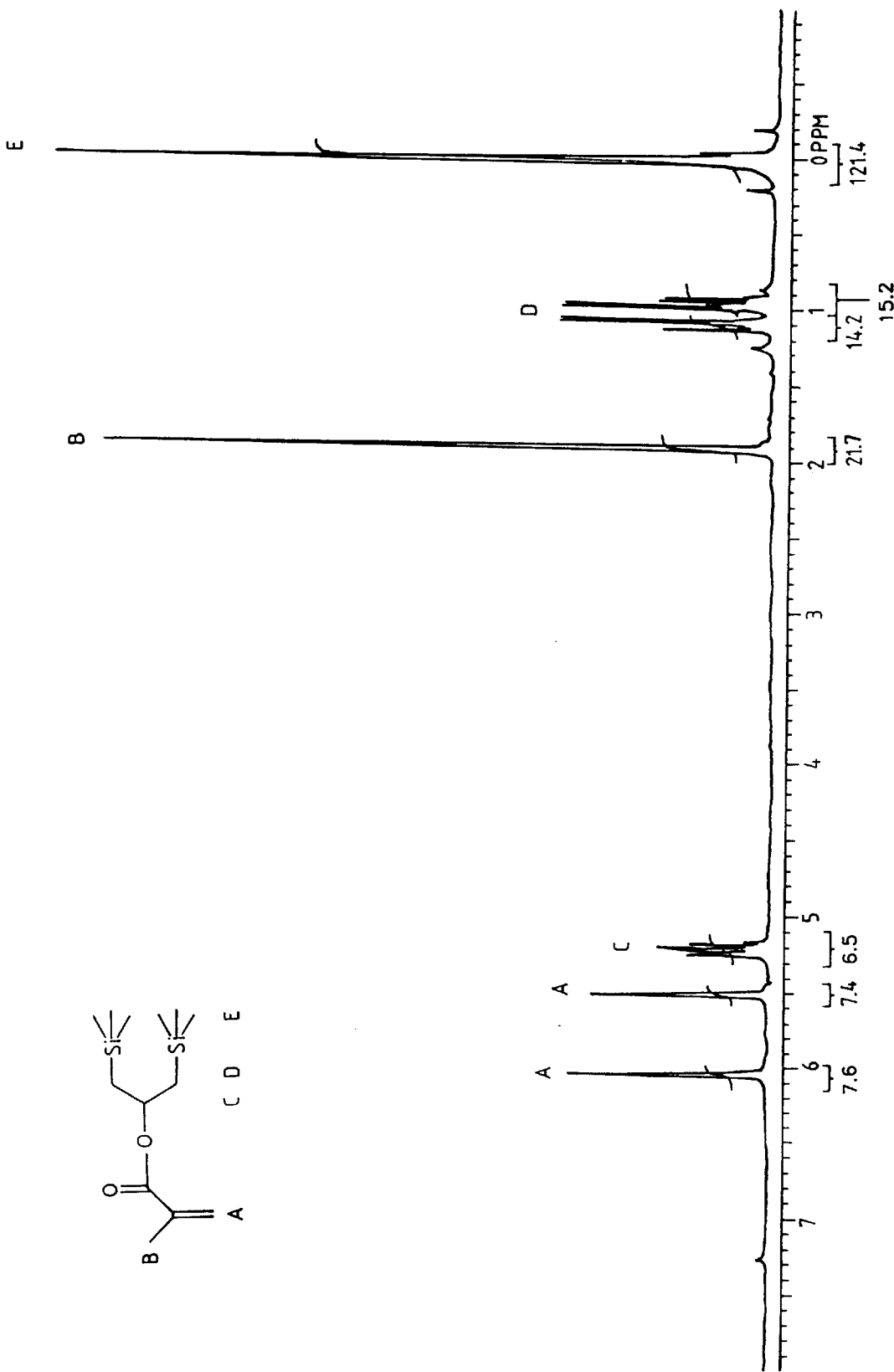
FIG. 3 is a graph illustrating an NMR analysis of a monomer used in forming a polymer of the invention.
Figure 4:
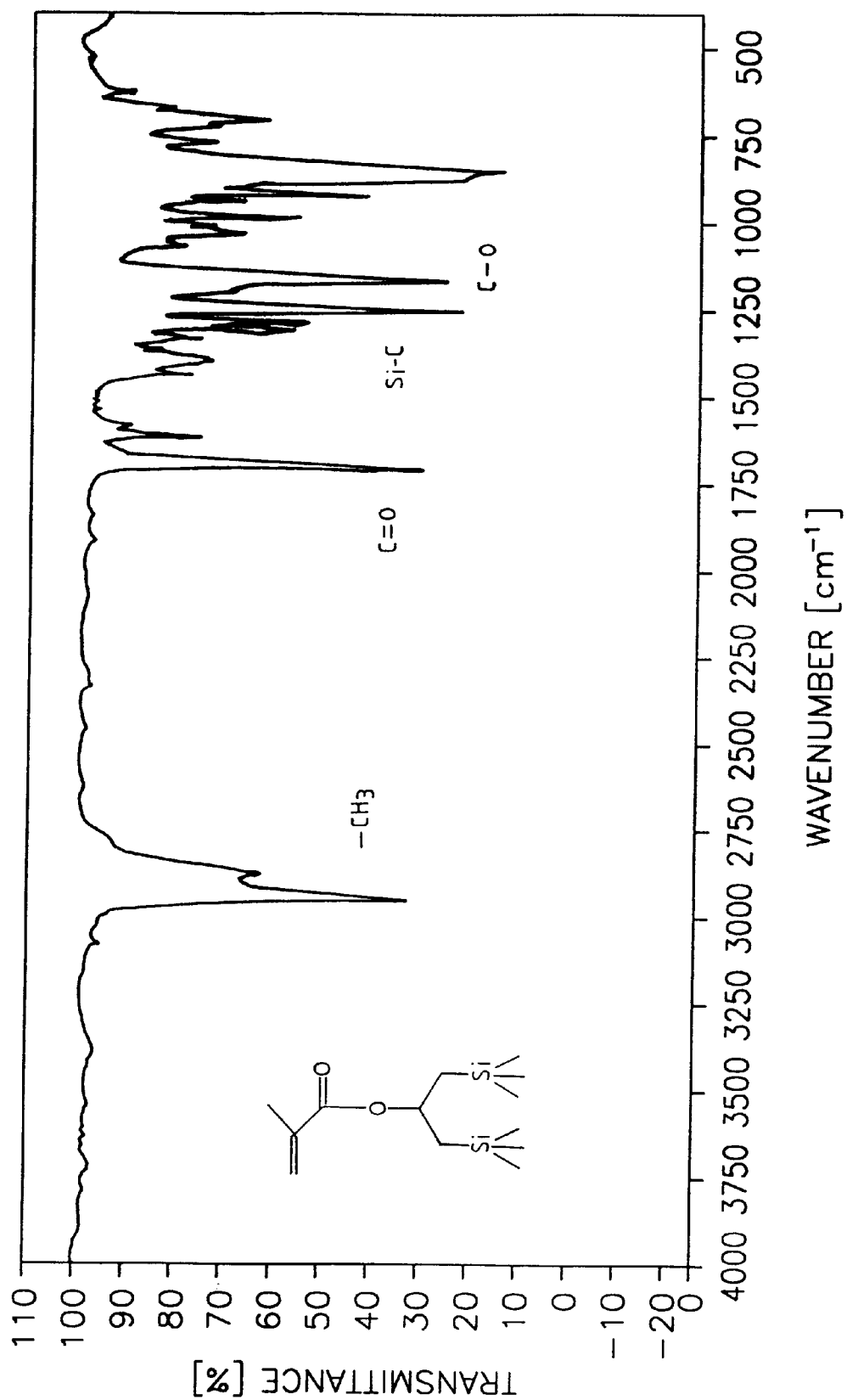
FIG. 4 is a graph illustrating an FT-IR analysis of a monomer used in forming a polymer of the invention.

FIG. 3 shows an NMR analysis of BPMA represented by formula (II) and FIG. 4 illustrates the result of the FT-IR analysis of the same. The results set forth in these graphs are as follows.
$^1$H-NMR (CDCl$_3$, ppm): 0.0(18H, Si—CH$_3$), 1.0(4H, —CH$_2$—), 1.9(3H, —CH$_3$), 5.2 (1H, —CH—), 5.5 and 6.0(2H, =CH$_2$)FT-IR(NaCl, cm$^{-1}$): 2950(C—H), 1720 (C=O), 1600(C=C), 1400 and 1260 (Si—C)

EXAMPLE 2

Synthesis of a Homoploymer 0.1 mol of BPMA of formula (II) synthesized in Example 1 and 4 mol percent of azobisisobutyronitrile (AIBN) were dissolved in toluene. The polymerization reaction was carried out between 65° C. and 70° C. for 24 hours under a nitrogen (N$_2$) purge.

The resulting product was precipitated in an excess of n-hexane, and then the precipitates were dissolved in tetrahydrofuran (THF). The precipitates were then reprecipitated in n-hexane.

The obtained precipitates were dried in a vacuum oven which was maintained at 50° C. for 24 hours. A homopolymer represented by the formula below was obtained at 80 percent yield.

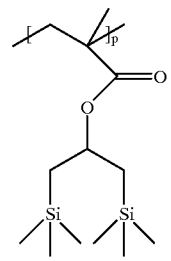

The weight average molecular weight of the obtained homopolymer was 24,000 and the polydispersity of the homopolymer was 2.2. The theoretical silicon content was determined to be 21 percent.

Figure 5:
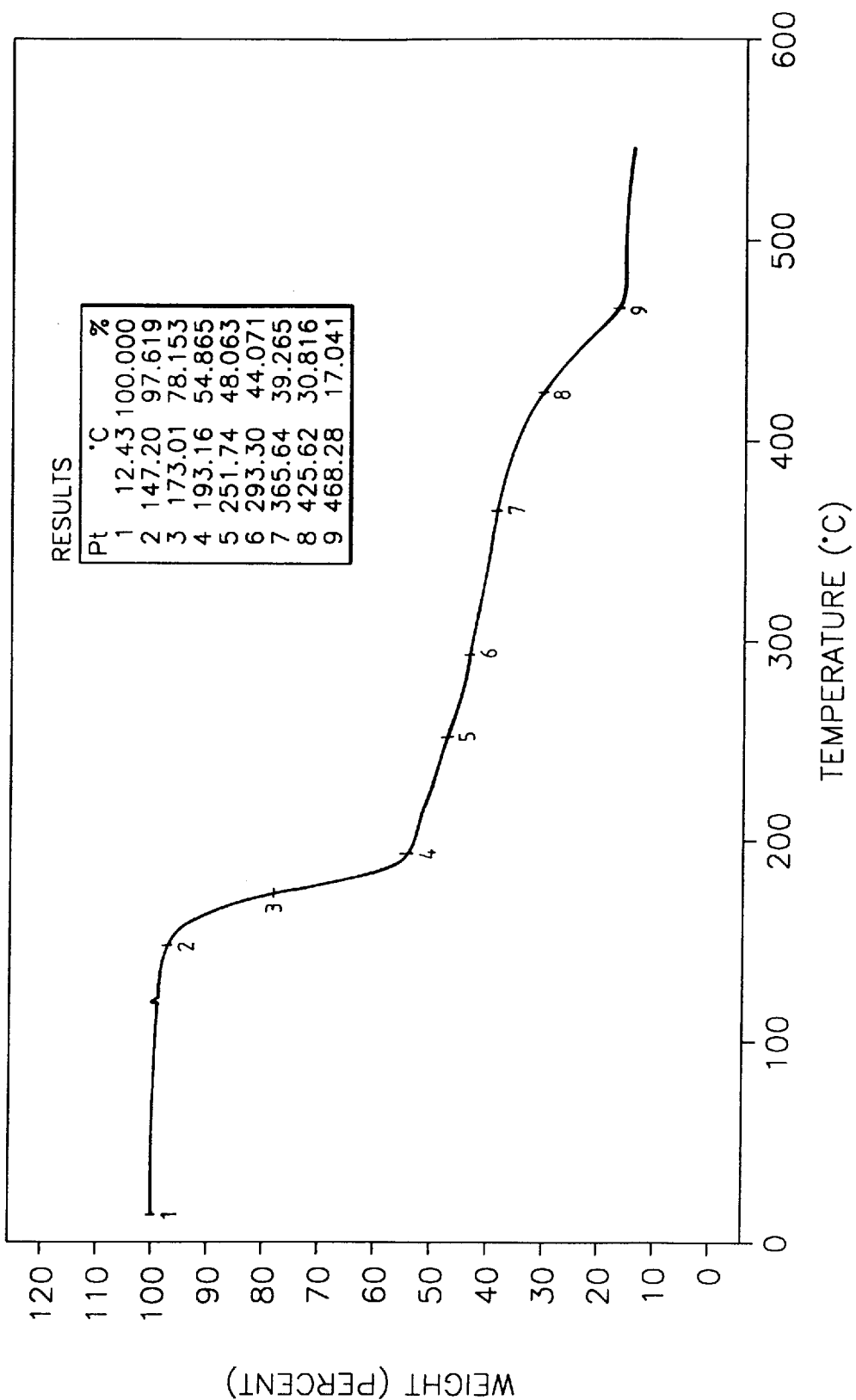
FIG. 5 is a graph illustrating a Thermogravimetric Analysis (TGA) of a homopolymer of the invention.

FIG. 5 is a graph illustrating the thermal stability of the homopolymer obtained in the present example as determined by TGA. The homopolymer was heated at a rate of 20° C./min. under a nitrogen atmosphere. The change in the weight of the homopolymer was determined as a function of the change in temperature, and is expressed as a percentage. As shown in FIG. 5, the initial decomposition temperature of the homopolymer is about 173° C.

EXAMPLE 3

Synthesis of a Copolymer

A reaction pathway for synthesizing a copolymer having the formula (III) in this example is expressed as follows:

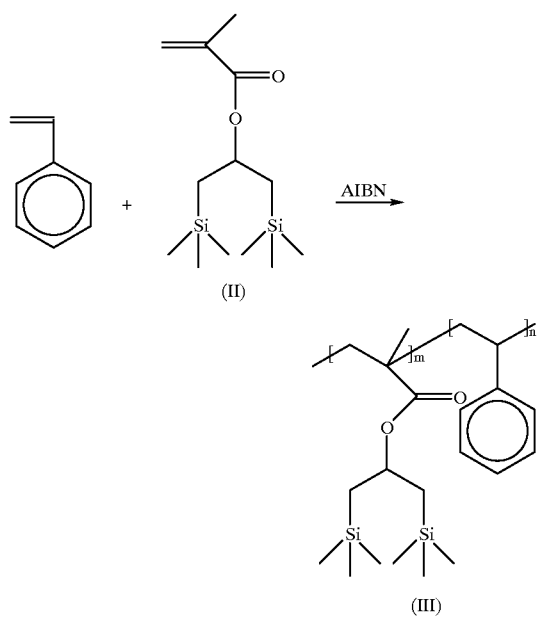

0.1 mol of the monomer BPMA (II) prepared in Example 1 and 0.1 mol of styrene monomer were dissolved in tetrahydrofuran (THF) and 4 mol percent of azobisisobutyronitrile (AIBN). The amount of THF employed was five times the volume of the monomers. The reactants were purged with nitrogen and the polymerization was carried out for about 24 hours.

The resulting polymerization product was precipitated in an excess of n-hexane. The precipitates were then dissolved in THF in order to be reprecipitated in n-hexane. The obtained precipitates were dried in a vacuum oven for 24 hours and a product yield of 70 percent was obtained. The precipitates are represented by copolymer having the formula (III).

The weight average molecular weight of the copolymer (III) was determined to be 15,000 and the polydispersity thereof was 2.1. The theoretical content of silicon was determined to be 15 percent.

EXAMPLE 4

Synthesis of a Copolymer

A similar procedure to Example 3 was carried out except that 0.1 mol of maleic anhydride was employed. The final precipitate is expressed by the copolymer having the formula (IV) and a product yield of 70 percent was obtained.

(IV)

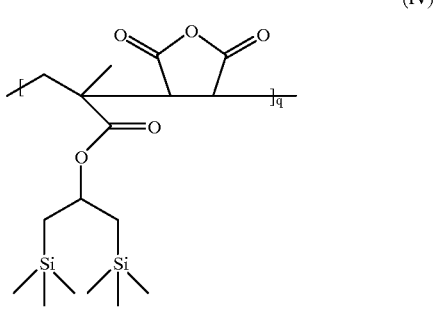

The weight average molecular weight of copolymer (IV) was found to be 8,000 and the polydispersity of the copolymer (IV) was determined to be 2.3. The theoretical silicon content of copolymer (IV) was 15 percent.

EXAMPLE 5

Synthesis of a Terpolymer

In this example, a reaction pathway for synthesizing a terpolymer having the formula (V) is expressed as follows:

(V)

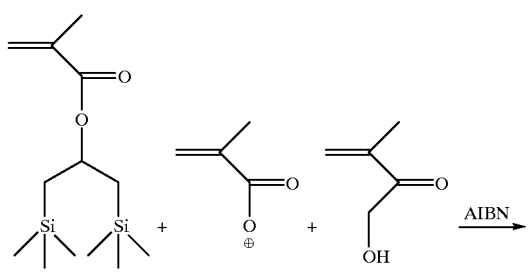

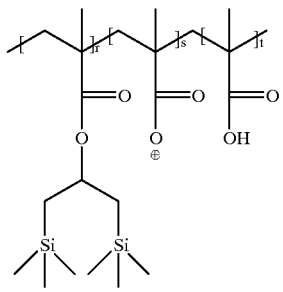

0.1 mol of BPMA (II) described in Example 1, 0.1 mol of t-butyl methacrylate (tBMA), and 0.1 mol of methacrylic acid (MAA) were dissolved in THF and 4 mol percent of AIBN. The THF was used in an amount which was 5 times the volume of the monomers. The above reactants were purged with nitrogen and the polymerization was carried out for about 24 hours.

The polymerization product was precipitated in an excess of n-hexane.

The precipitates were then dissolved in THF in order to be reprecipitated in n-hexane. The resulting precipitates were subsequently dried in a vacuum oven maintained at about 501° C. for about 24 hours. A terpolyer represented by the formula (V) was obtained and a product yield of 75 percent was obtained.

The weight average molecular weight of terpolymer (V) was determined to be 25,000 and the polydispersity was found to be 2.3. The theoretical content of silicon in terpolymer (V) was determined to be 11 percent.

Figure 6:
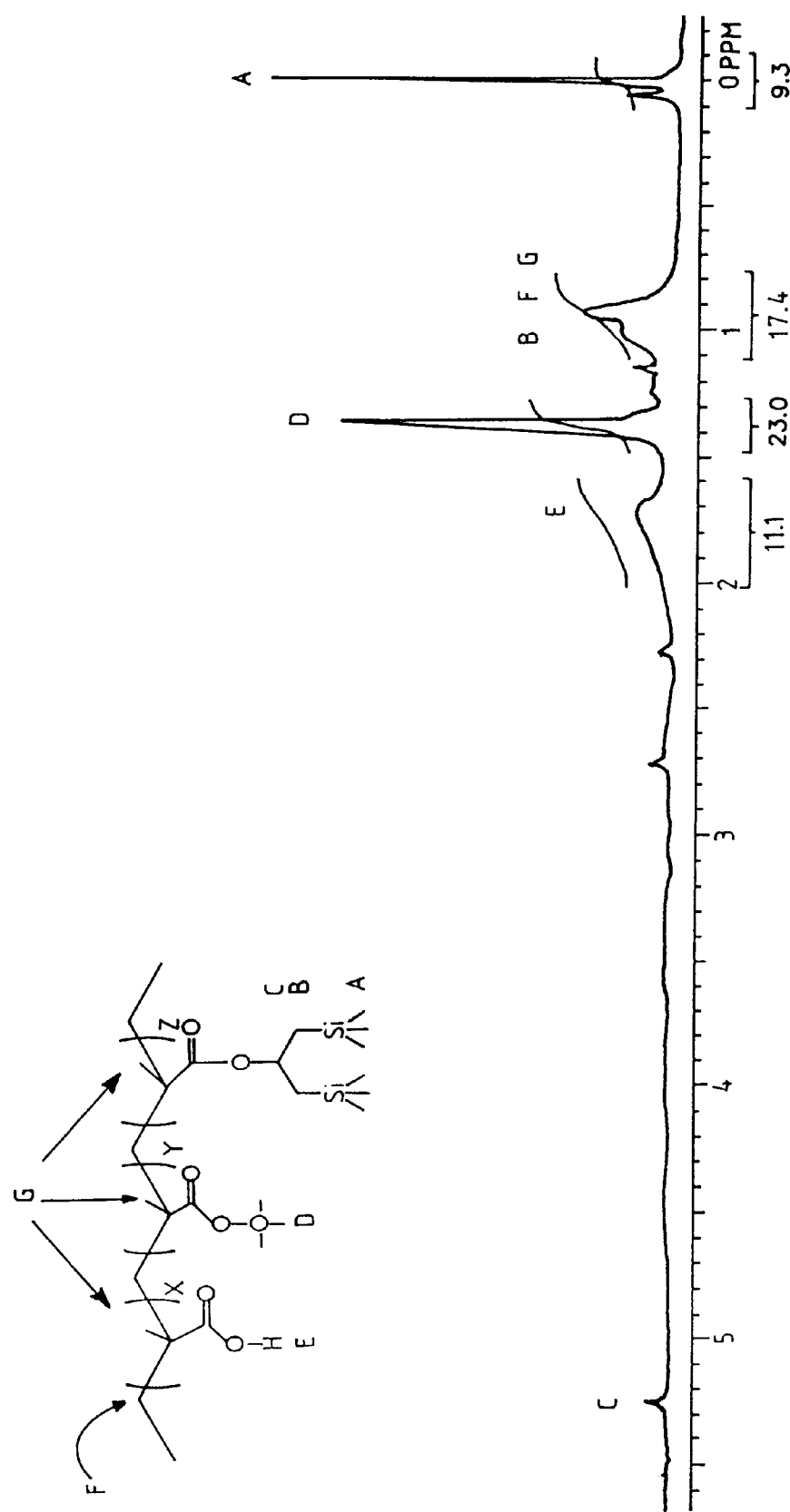
FIG. 6 is a graph illustrating an NMR analysis of a terpolymer of the invention.
Figure 7:
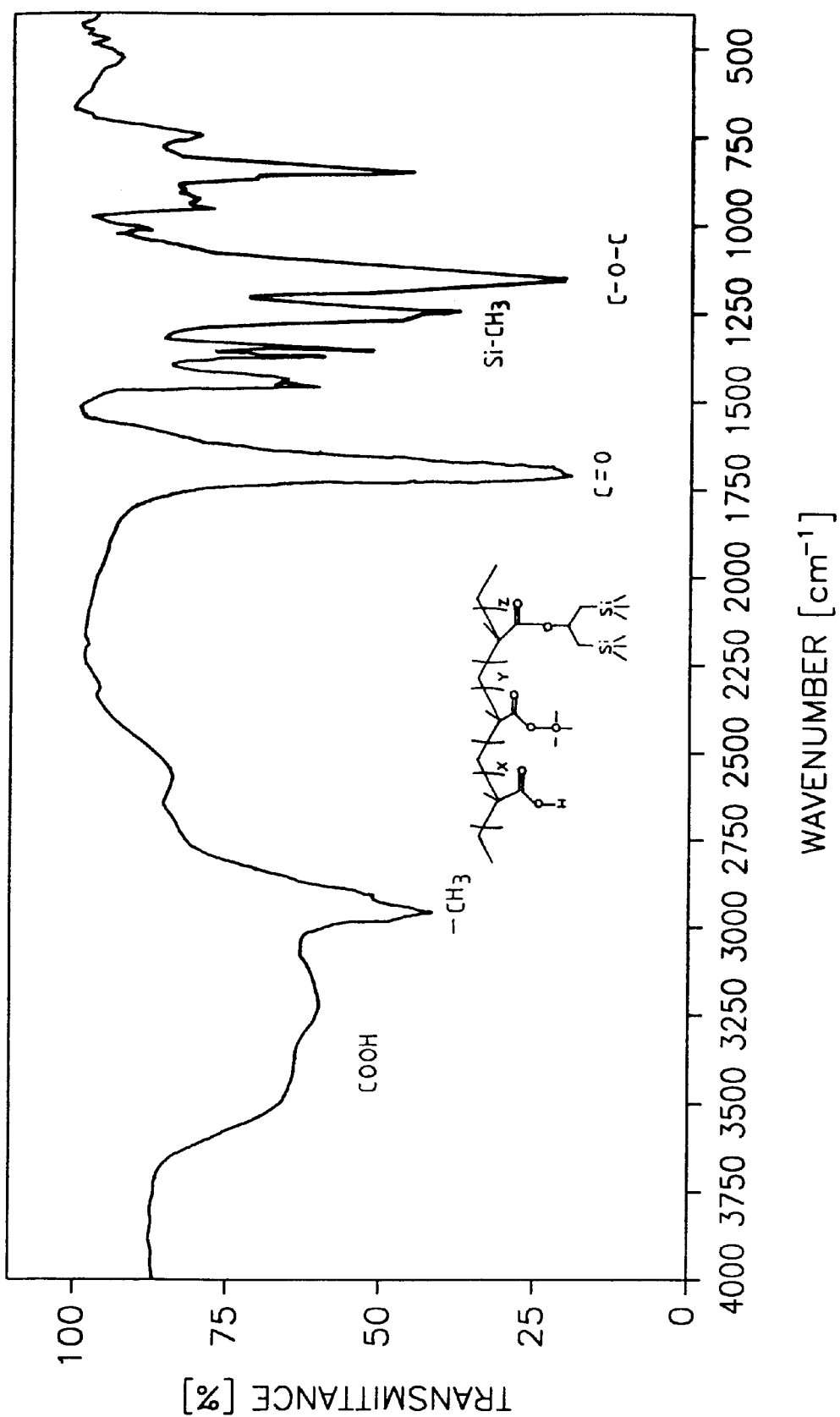
FIG. 7 is a graph illustrating an FT-IR analysis of a terpolymer of the invention.
Figure 8:
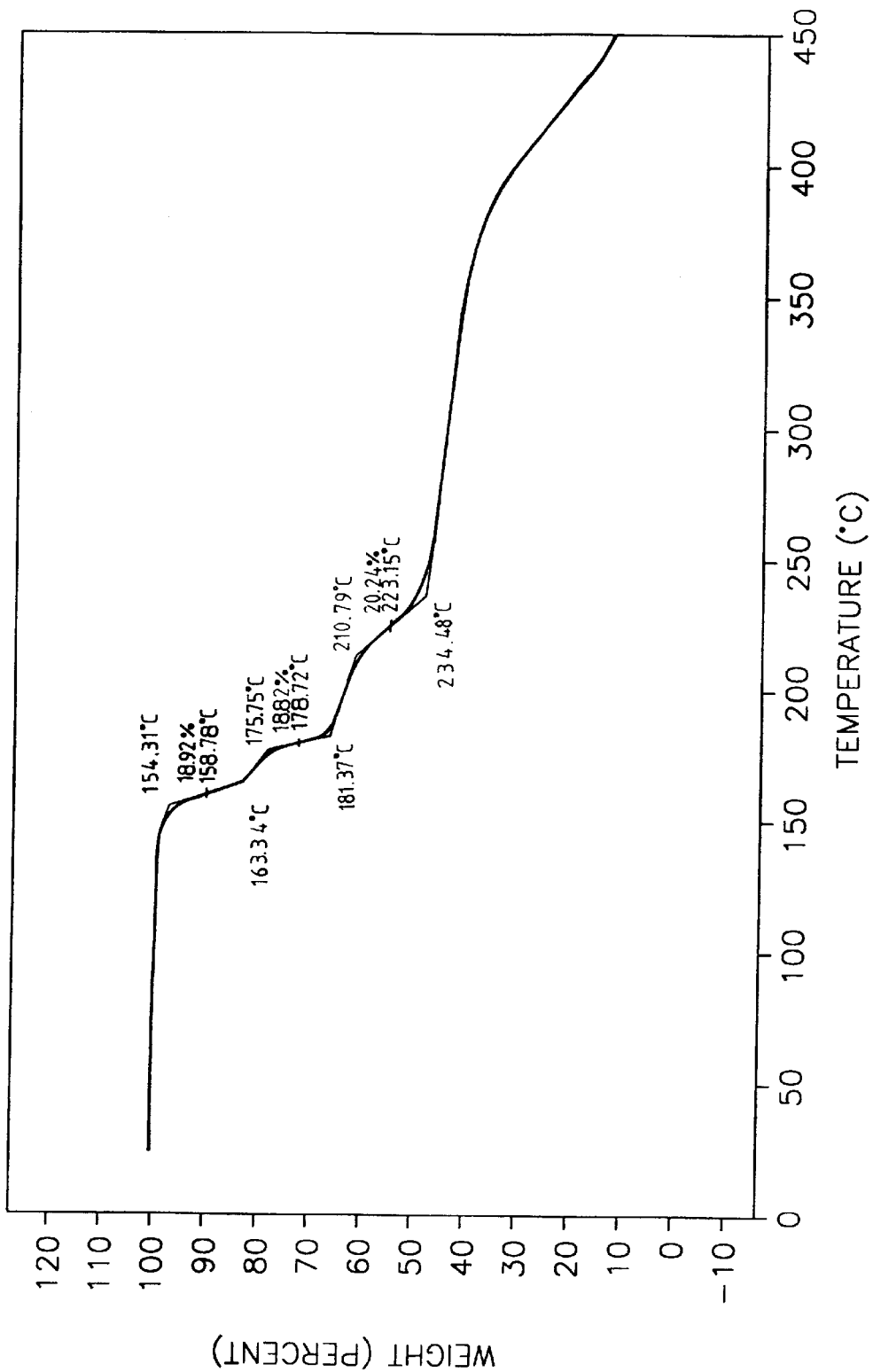
FIG. 8 is a graph illustrating a TGA analysis of a terpolymer of the invention.

FIG. 6 illustrates the NMR analysis of terpolymer (V) obtained by the synthesis of this example. FIG. 7 illustrates the FT-IR analysis of terpolymer (V). FIG. 8 is a graph depicting the thermal stability of terpolymer (V) evaluated by TGA. As shown in FIG. 8, terpolymer (V) begins to decompose at about 160° C., thus exhibiting good thermal stability.

EXAMPLE 6

Synthesis of a Tetrapolymer 0.1 mol of BPMA (II) synthesized in Example 1, 0.1 mol of tBMA, methyl methacrylate (MMA), and 0.1 mol of MAA were dissolved in 4 mol percent of AIBN and THF. An amount of THF was used which was 5 times the volume of the monomers. The above reactants were purged with nitrogen, and the polymerization was performed under reflux for about 24 hours.

The obtained product was precipitated in an excess of n-hexane. The resulting precipitates were then dissolved in THF in order to be reprecipitated in n-hexane. The obtained precipitates were dried in a vacuum maintained at about 50° C. for 24 hours. A tetrapolymer having the formula (VI) was obtained and a product yield of 75 percent was obtained.

(VI)

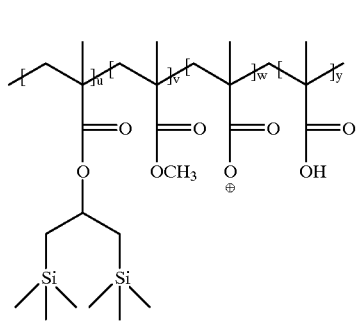

The weight average molecular weight of tetrapolymer (VI) was determined to be 24,000 and the polydispersity of tetrapolymer (VI) was found to be 2.4.

Figure 9:
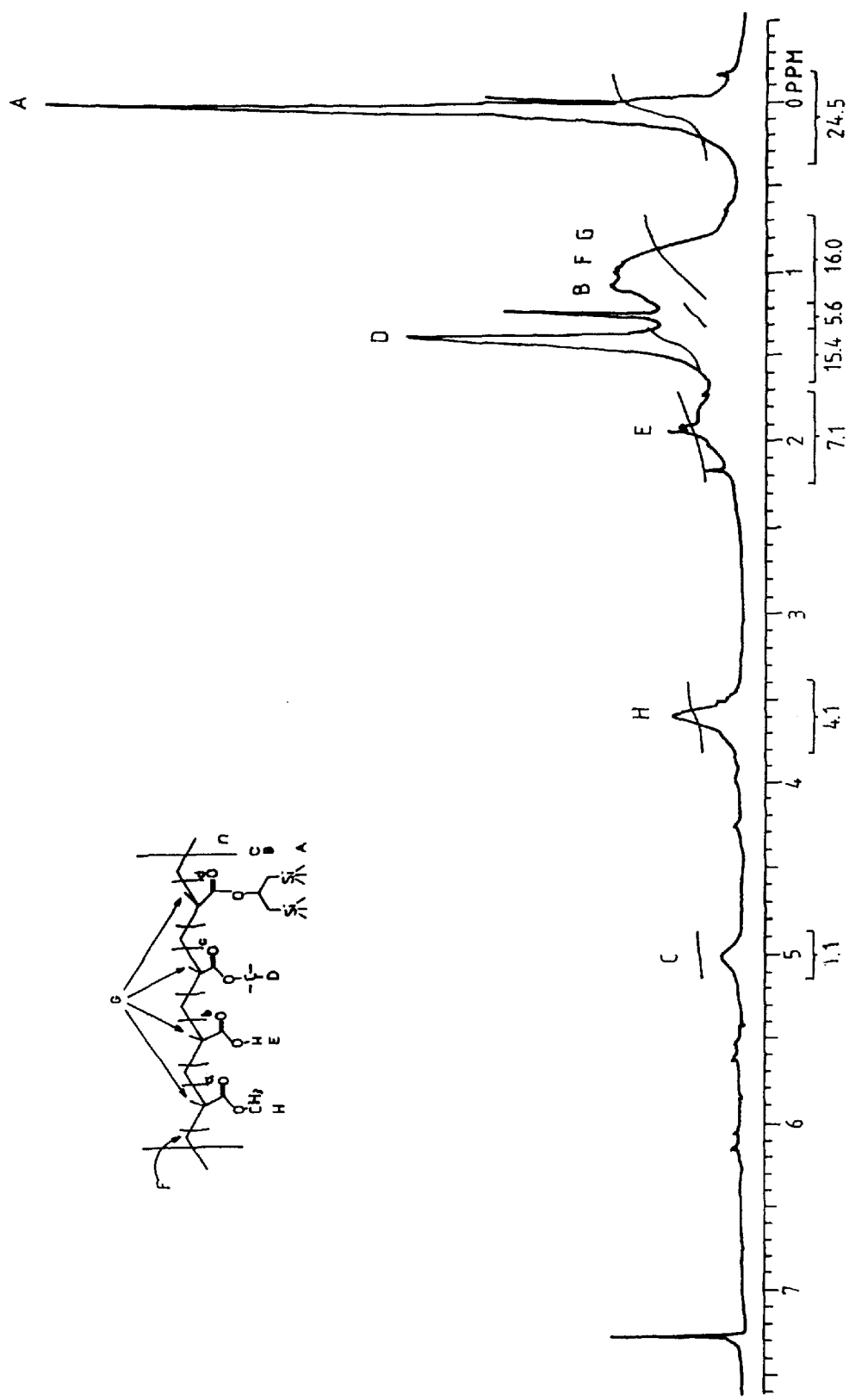
FIG. 9 is a graph illustrating an NMR analysis of a tetrapolymer of the invention.
Figure 10:
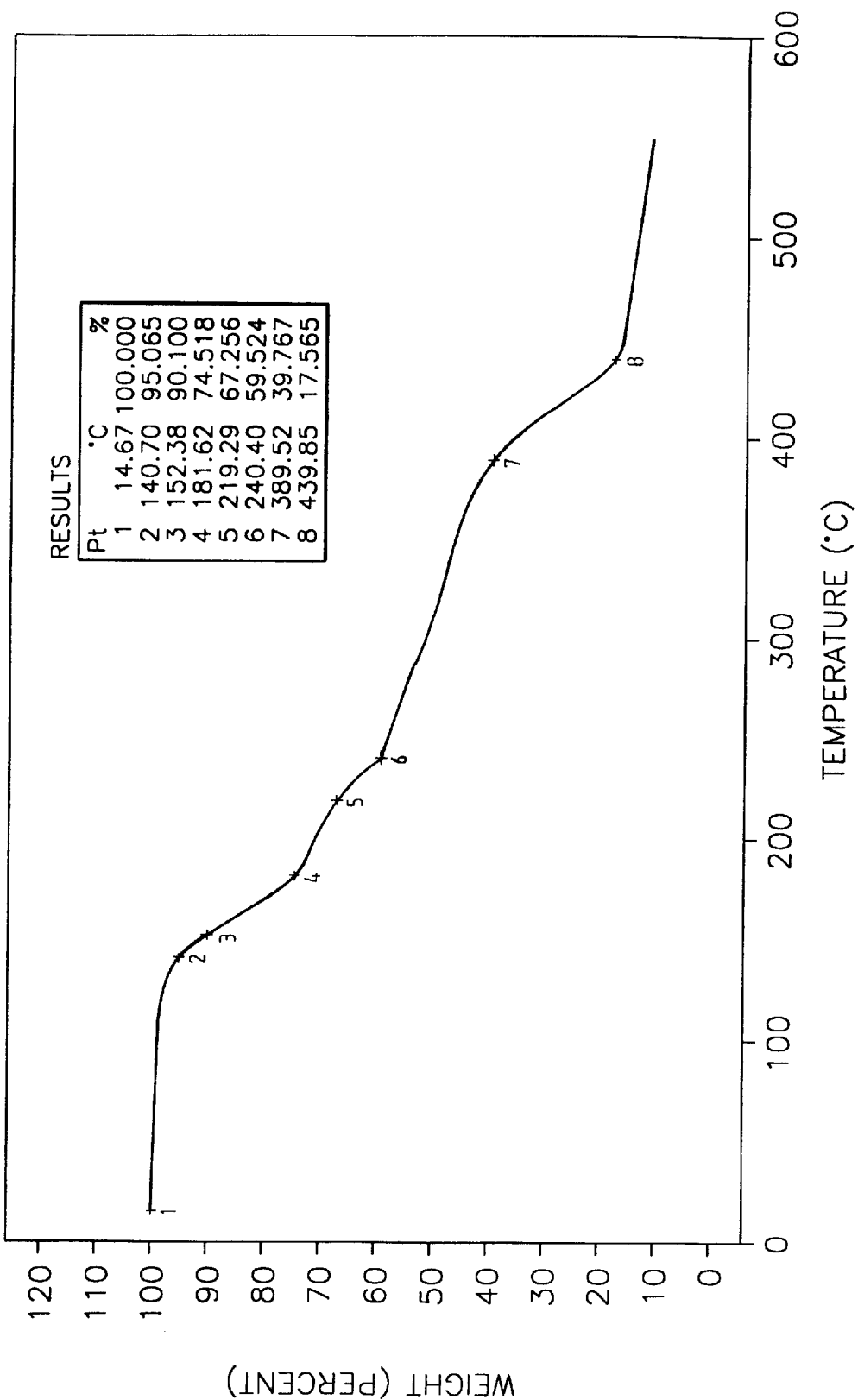
FIG. 10 is a graph illustrating a TGA analysis for a tetrapolymer of the invention.

FIG. 9 shows an NMR analysis of tetrapolymer (VI) synthesized in this example. FIG. 10 is a graph showing the thermal stability of tetrapolymer (VI), evaluated by TGA. As illustrated in FIG. 10, tetrapolymer (VI) displays approximately a 50 percent weight loss at about 141° C. This weight loss value may suggest that the tetrapolymer (VI) decomposes at a relatively high temperature exhibiting favorable thermal stability.

EXAMPLE 7

Formation of a Resist Composition 1.0 g of terpolymer (V) synthesized in Example 5 was dissolved in 8 g of propylene glycol monomethyl ether acetate. 0.02 g of photoacid generator, namely triphenylsulfonium triflate (TPSOTf), was added to the above components, and the mixture was then stirred. The mixture was subsequently filtered using a 0.2 μm filter and a resist composition was obtained. The resist composition was spin coated onto a wafer such that a thickness of 0.3 μm was obtained.

The wafer coated with the resist composition was softbaked at a temperature of about 110° C. for about 90 seconds, and exposed using a stepper adopting a KrF excimer laser having 0.45 numeric aperture (NA). The exposed wafer was then post-baked at 110° C. for about 90 seconds. The resist was then developed using a solution of tetramethylammonium hydroxide (TMAH).

The exposure mechanism set forth in this example may be illustrated by the following reaction scheme:

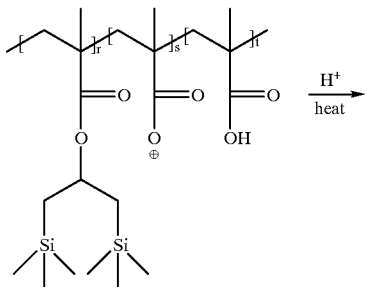

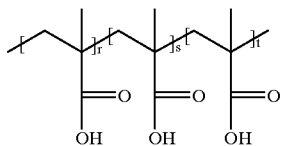

Advantageously, the above terpolymer prior to exposure displays a limited solubility in a developer, while the post-exposure terpolymer may exhibit a high level of solubility in a developer.

In the drawings, specification, and examples, there have been disclosed typical preferred embodiments of the invention and, although specific terms are employed, they are used in a generic and descriptive sense only and not for the purposes of limitation, the scope of the invention being set forth in the following claims.

That which is claimed:

1. A monomer that may be employed in a chemically amplified resist, said monomer represented by the formula:

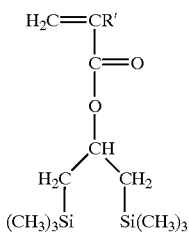

wherein R' is selected from the group consisting of hydrogen and methyl.

2. A process for preparing a monomer that may be employed in a chemically amplified resist, said process comprising:

reacting a monomer of the formula:

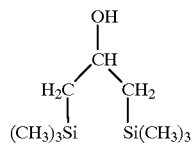

with a (meth)acrylate monomer to produce a monomer of the formula:

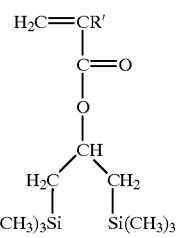

wherein R' is selected from the group consisting of hydrogen and methyl.

3. A process according to claim 2, wherein the (meth)acrylate monomer is (meth)acryloyl chloride.

4. A process according to claim 2, wherein said reacting step occurs in an organic solution.

5. A process according to claim 4, wherein the organic solution comprises triethylamine and methylene chloride.

* * * * *